Figure 1:
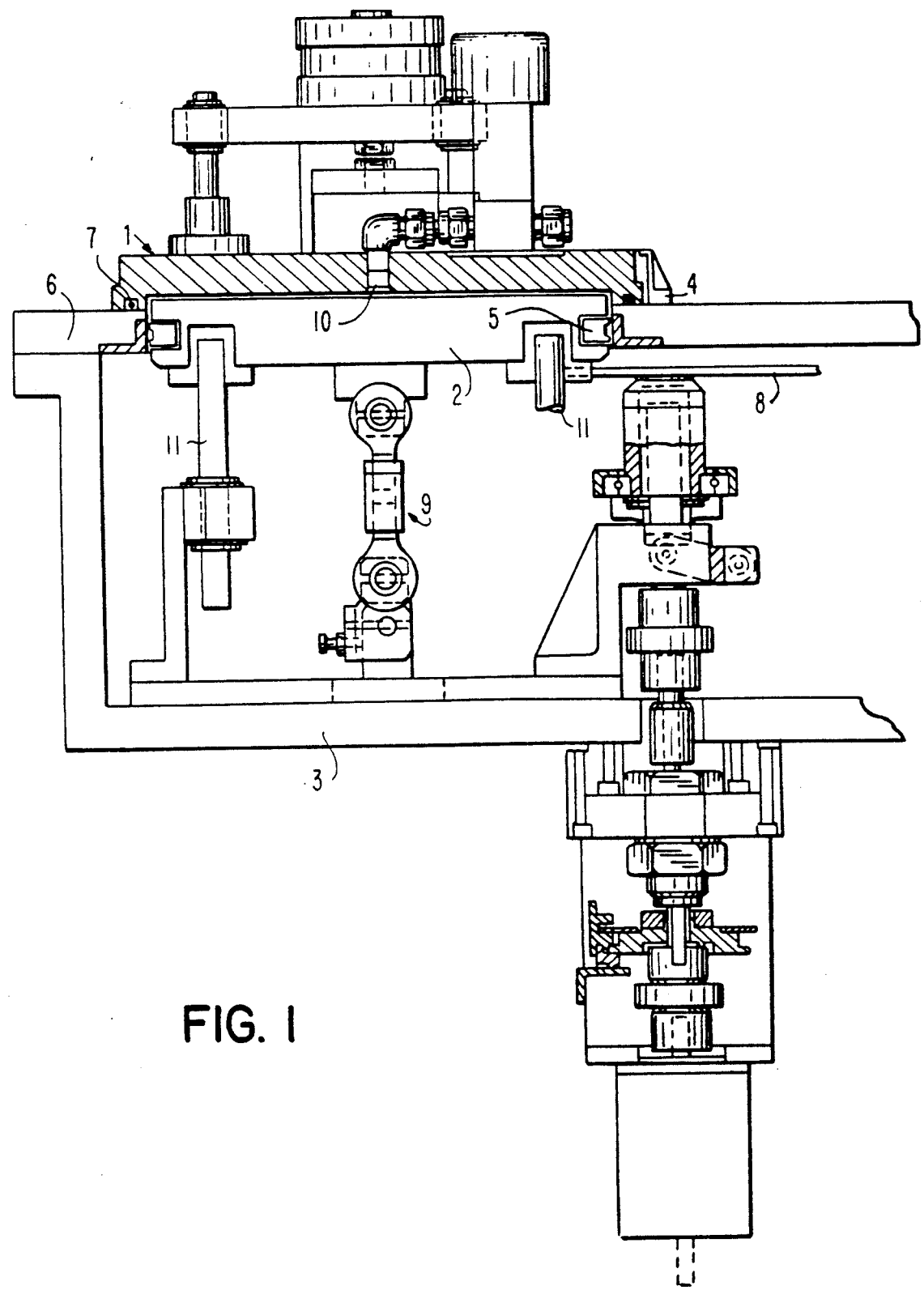

United States Patent [19]

Toro-Lira et al.

[11] Patent Number: 5,176,493
[45] Date of Patent: Jan. 5, 1993

[54] HIGH SPEED WAFER HANDLING METHOD

[75] Inventors: Guillermo L. Toro-Lira, Sunnyvale; Alan C. Abel; Alan H. Achilles, both of San Jose, all of Calif.

[73] Assignee: North American Philips Corporation, New York, N.Y.

[21] Appl. No.: 805,232

[22] Filed: Dec. 11, 1991

Related U.S. Application Data

[60] Division of Ser. No. 611,389, Nov. 5, 1990, Pat. No. 5,098,245, which is a continuation of Ser. No. 315,068, Feb. 24, 1989, abandoned.

[51] Int. Cl.$^5$ .............................................. B65G 65/00
[52] U.S. Cl. .................................... 414/786; 414/217; 414/416
[58] Field of Search ............... 414/217, 221, 222, 225, 414/422, 416, 786

[56] References Cited

U.S. PATENT DOCUMENTS

| | | | |
|---|---|---|---|
| 3,677,419 | 7/1972 | Giffen | 414/732 X |
| 3,968,885 | 7/1976 | Hassan et al. | 414/217 X |
| 4,355,937 | 10/1982 | Mack et al. | 414/217 |
| 4,584,045 | 4/1986 | Richards | 414/222 X |
| 4,632,624 | 12/1986 | Mirkovich et al. | 414/222 X |
| 4,674,939 | 6/1987 | Maney et al. | 414/217 X |
| 4,705,444 | 11/1987 | Tullis et al. | 414/217 X |
| 4,781,511 | 11/1988 | Harada et al. | 414/217 |
| 4,861,563 | 8/1989 | Shekerjian et al. | 414/217 X |
| 4,915,564 | 4/1990 | Eror et al. | 414/786 X |

Primary Examiner—Frank E. Werner
Assistant Examiner—James Keenan
Attorney, Agent, or Firm—Paul R. Miller

[57] ABSTRACT

The present invention describes a loading system for high speed loading of wafers, such as semiconductor wafers, into vacuum chambers for various applications such as inspection or processing using, for example, a SEM. This system provides low contamination from atmospheric conditions both on loading and unloading the wafers.

5 Claims, 2 Drawing Sheets

FIG. I

HIGH SPEED WAFER HANDLING METHOD

This application is a divisional application of previous application Ser. No. 07/611,389, filed Nov. 5, 1990, now U.S. Pat. No. 5,098,245, which is a continuation of grandparent application Ser. No. 07/315,068, filed Feb. 24, 1989, now abandoned, and all benefits of such earlier applications are hereby claimed for this new divisional application.

This invention involves a wafer handler mechanism useful for semiconductor wafer handling which mechanism uses a loading chamber for introducing the wafer into vacuums to minimize contamination of the wafer and chamber, and which has minimum volume and surface area.

Wafer handlers are a critical part for a number of different processes particularly metrology instruments, such as in the inspection or processing of flat samples, such as magnetic disks, and further in any such applications requiring vacuums. In this respect, electron beam lithography, plasma etchers, scanning electron microscopy (SEM), and laser and conventional light optics are among many applications requiring contamination-free wafer handling. In-vacuum wafer handling is one of the most important factors affecting inspection speeds of the SEM. In addition to the vacuum requirement, the relatively low signal-to-noise ratio of images in the produced SEM inspection are the main reasons why light-optics microscopes are generally faster and easier to operate. Further, the vacuum environment can create negative secondary effects to the device wafers, and can also increase the potential of particle and other types of contamination.

Electron beam systems require the wafer to be under vacuum. Semiconductor wafers are sensitive to minute quantities of contamination and must be afforded "clean" pressure transition and transport so as not to compromise their quality. This must be accomplished repeatedly and reliably at sufficient speeds to enable the measuring instrument to accommodate production line quantities of hundreds of wafers per day.

The presently claimed invention sets forth a wafer handling system that can be utilized in vacuum applications to substantially reduce inherently slow wafer exchange times of the SEM, for example. It also minimizes the potential of particle contamination onto or into the wafers.

The invention provides reliable, clean, high speed transfer of wafers, such as semiconductor wafers including integrated circuits, from a place of normal atmospheric pressure to a place of vacuum pressure and from the vacuum back to atmosphere. It is also applicable to operations involving the clean, rapid transport of an object from one zone of ambience to another. These include other operations associated with the development, manufacture, inspection and testing of microelectronic devices such as: lithography, etching, ion implant, epitaxy, electron microscopy, chemical vapor deposition, vacuum deposition, and various combinations of these and other processes and procedures. The invention is also applicable to operations involving the development, manufacture, inspection and testing of superconductor devices, solar cells, magnetic data disks, magneto-optical data disks, optical data disks, CD ROM disks, video disks, compact audio disks, and video still camera and recorder disks.

Prior wafer handling systems may be seen by reference, for example, to integrated circuit wafer handling systems as in U.S. Pat. No. 4,604,020 to one of the present inventors. In such previous arrangement, motor driven magnetic structures are utilized. The present invention, on the other hand, significantly improves such devices by minimizing internal moving parts inside of the structure upon loading, together with its minimum volume and surface area.

These advantages occur by use of a novel vacuum lock system or pressure transition chamber in which wafers can be inserted into a main vacuum chamber with minimum loss of vacuum and then pumped down to an appropriate vacuum pressure. That is, gas that would be introduced upon loading the vacuum chamber lock is minimized. The total volume of the lock system is similar to the volume of a few wafers, while the total surface area can be of the order of the surface area of a single wafer.

Further, the vacuum seals are circular and present minimal mechanical sliding friction during actuation. This enables long-term reliability of several orders of magnitude higher than typical rectangular gate valves. There are no mechanical moving parts inside the load lock chamber. Therefore, no static or kinetic friction occurs that may cause generation of particles to contaminate the wafers. The prior art techniques of "slow venting" and "slow rough" procedures to minimize the effect of particle contaminations into the wafers due to gas turbulence effects are then eliminated.

The door and ring shield arrangement of the present invention provides optimum controllable gas "purging" conditions that minimize the potential of introducing environmental contaminants, such as humidity, particles, and other contaminations into the load lock chamber during wafer introduction. High throughput for single wafer inspection is achieved due to the minimum vacuum lock chamber size associated with the gas load. High throughput for queueing wafer inspection due to the use of an internal rotary arm achieves advantages in swapping incoming and outgoing wafers.

The external vacuum seal of the pressure transition chamber or lock is a solid, circular elastomer O-ring located in the systems outer door. The seal is activated in a manner that applies or removes sealing compression with minimal sliding force. This minimizes contaminant particle generation in the lock. The small distance (about 1 cm) that the seal moves to permit wafer transfer provides for high speed operation. A highly reliable, electro-pneumatic driving mechanism for this seal is located external to the lock to eliminate contamination from its moving parts.

The internal seal of the lock chamber is a highly reliable inflatable elastomer activated by gas pressure. This seal produces low contamination levels, since it requires no mechanical moving parts in the lock chamber and is positioned below the wafer. Seal integrity is not influenced by the force of atmospheric pressure that acts on the elevator. The bulk of this force is transferred to the main chamber through an elevator drive linkage.

The lock chamber is of minimum volume and surface area to provide fast pressure transition. Small volume also allows the lock to be built into the outer door, eliminating the need for a separate lock chamber external to the system.

When the outer door is unsealed or opened, airborn contamination and humidity are restricted from lock entry by the minimal opening of the door, a positive dry gas purging from the lock, and an additional circular ring shield that further restricts the opening to the lock.

Operation of the system may be automated by using computer control with appropriate software.

Consequently, a very simple design has been implemented with a low number of mechanical parts and mechanical action. Therefore, low manufacturing costs with high reliability are achieved by the presently claimed invention.

The presently claimed invention provides a high speed vacuum lock chamber for transferring large diameter semiconductor wafers. Such vacuum lock provides a minimum contamination by gas for SEM wafer inspection applications.

Figure 2:
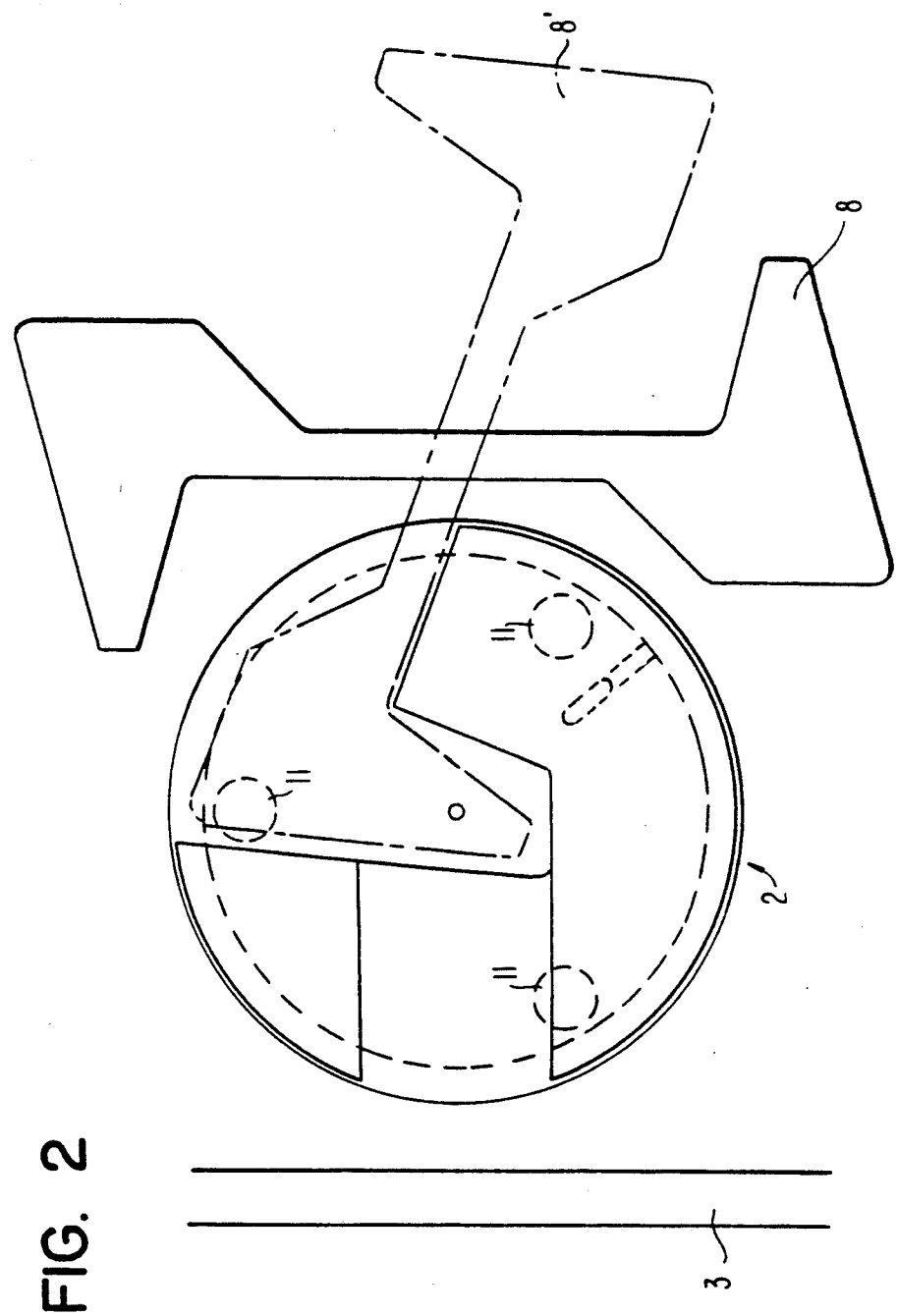

Some embodiments of a wafer handling system in accordance with the present invention will now be described by way of example with reference to the accompanying drawings in which:

FIG. 1 is a cross section of a wafer vacuum lock chamber system according to the present invention; and FIG. 2 is a top view of a portion of this wafer loading system according to the present invention.

FIG. 1 illustrates a mechanism according to the present invention for achieving high speed wafer transfer into an inspection system, such as a SEM as described in Applicants' corresponding application Ser. No. 315,067, filed Feb. 24, 1989, on even date herewith. The structure for wafer transfer includes a door 1 for loading wafers into the device and locking the closed door from the environment, and an elevator 2, which are both mounted onto and into a main vacuum chamber 3. The door 1 is circular and isolates the lock chamber structure from the atmosphere, and the wafer elevator 2 also isolates the door from the main vacuum chamber by way of an inflatable seal 5 when the door is opened. The door contains a circular 0-ring seal 7 and associated air valves 10 for lock pre-evacuation venting.

Wafer access occurs when the door 1 is open. A circular ring shield 4 encloses the majority of the door circumference so that when the door is open, the structure is partly isolated from the atmospheric environment.

The elevator unit 2 contains the circular inflatable vacuum seal 5 around its periphery. When pressurized, the seal 5 seals the lock chamber onto the round opening of the lid 6 of the main chamber 3 when the elevator 2 is in the position shown in FIG. 1.

The elevator has the further function of transferring a wafer into the main chamber. A rotary transfer arm 8 is located inside the main vacuum chamber 3 and is used to transfer the wafer from the elevator 2 to an internal stage chuck (not shown) for the inspection apparatus.

A drive linkage 9, also known as a toroidal latch, is provided for moving the elevator 2 up and down along guides 11. This movement is a sinusoidal motion where the movement at start and stop of the elevator 2 is slow, while the motion in the middle of movement of the linkage is fast. No abrupt motion occurs in order to eliminate sliding or vibration of the wafer on the elevator 2.

The elevator structure and the transfer arm may be further seen by way of FIG. 2 in which the elevator 2 is shown as a circular arrangement seen from the top onto which the wafers are provided. The transfer arm 8 is rotatable over the surface of the elevator, after it is lowered, to pick up wafers and move them off of the elevator structure. In a wafer queueing mode of operation in which incoming and outgoing wafers are transferred, the internal transfer arm will swap the wafers. A robotic arm (not shown) transfers the wafers between cassettes of wafers, an optical pre-aligner, and the elevator structure 2.

In operation, for introducing wafers, the door 1 is raised to the extent of the lip of the circular ring shield 4. The wafer is inserted onto the elevator, and the door is brought downward into sealing relationship to the chamber lid 6. At that point, the elevator 2 is lowered to a position so that the transfer arm 8 will take the wafer from the elevator's upper surface and transfer it internally into the internal structure of the vacuum chamber.

Alternate operations can occur in the structure of the present invention. First, before the seal 5 is deflated, a rough evacuation is carried out under the door 1 to evacuate a majority of the gas. Then the door 1 is closed, and the seal 5 is deflated. Thereafter the elevator 2 is lowered. This minimizes the amount of gas transferred to the main chamber.

In a second arrangement, no such rough evaluation is carried out and the subsequent evacuation of the main vacuum chamber is necessary to create a proper vacuum.

With a structure as described, an operation sequence can be obtained for a single wafer operation in which the throughput is at least approximately 40–50 wafers per hour. In addition, a "pipeline" mode of operation has been established in which multiple wafers can be input into the vacuum system for measurements and subsequently output from the system. The system throughput under such multiple wafer conditions are at least approximately in the range of 60 to 70 wafers per hour.

What is claimed is:

1. A method of transferring wafers from atmosphere into and out of a vacuum system comprising the steps of
   (a) introducing wafers from atmosphere onto a platform structure at an opening of a vacuum chamber, said platform structure being beneath a closable door, and said closable door being movable outwardly from said opening by a small distance to introduce said wafers,
   (b) sealing said vacuum chamber from said atmosphere upon moving said closable door outwardly by inflating an elastomer seal surrounding said platform structure,
   (c) closing and sealing said closable door after introducing said wafers onto said platform structure,
   (d) then moving said wafers and said platform structure to a first position within said vacuum chamber,
   (e) rotatably transferring at least one of said wafers from said platform structure into said vacuum chamber by rotating an arm structure to pick-up said wafer at said first position and to move said wafer to a second position within said vacuum chamber for inspecting said wafers, and
   (f) returning wafers from said second position to said first position by continuing rotation of said arm structure after inspection of said wafers in said vacuum chamber.

2. A method according to claim 1, wherein a pre-evacuation about said wafers on said platform structure is carried out upon closing but before sealing said closable door in said step (c).

3. A method according to claim 1, wherein said step (b) is carried out by introducing gas pressure into said elastomer seal.

4. A method according to claim 1, wherein said step (a) is carried out by limiting said outward movement of said closable door by said small distance of about 1 cm.

5. A method according to claim 1, wherein said step (d) is carried out by moving said platform means into said vacuum chamber in a sinusoidal motion, said sinusoidal motion being slow movement at start and stop of said platform structure, and in between, said sinusoidal motion being fast movement, such that abrupt motion is eliminated to prevent sliding and vibration of said wafers on said platform structure.

* * * * *